(12) United States Patent
Steinbach et al.

(10) Patent No.: US 9,798,243 B2
(45) Date of Patent: Oct. 24, 2017

(54) OPTICAL DEVICE HAVING A DEFORMABLE OPTICAL ELEMENT

(71) Applicant: Carl Zeiss SMT GmbH, Oberkochen (DE)

(72) Inventors: Manfred Steinbach, Jena (DE); Armin Schoeppach, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/969,703

(22) Filed: Dec. 15, 2015

(65) Prior Publication Data
US 2016/0209752 A1 Jul. 21, 2016

Related U.S. Application Data

(63) Continuation of application No. 13/004,470, filed on Jan. 11, 2011, now Pat. No. 9,217,936, which is a (Continued)

(30) Foreign Application Priority Data

Jul. 14, 2008 (DE) .................... 10 2008 032 853

(51) Int. Cl.
*G03F 7/20* (2006.01)
*G02B 26/06* (2006.01)
*G02B 27/00* (2006.01)

(52) U.S. Cl.
CPC ........... *G03F 7/7015* (2013.01); *G02B 26/06* (2013.01); *G02B 27/0068* (2013.01); *G03F 7/70266* (2013.01); *G03F 7/70825* (2013.01)

(58) Field of Classification Search
CPC .. G03F 7/70825; G03F 7/709; G03F 7/70266; G03F 7/70808; G03F 7/70833;
(Continued)

(56) References Cited

U.S. PATENT DOCUMENTS 6,307,688 B1   10/2001  Merz et al.
6,398,373 B1 *  6/2002  Guzman ............ G02B 26/0825
                                                              359/846

(Continued)

FOREIGN PATENT DOCUMENTS

DE   198 59 634   6/2000
DE   101 40 608   3/2003

(Continued)

OTHER PUBLICATIONS

The International Search Report for corresponding PCT Application No. PCT/EP2009/058943, dated Apr. 1, 2010.

(Continued)

*Primary Examiner* — Steven H Whitesell Gordon
(74) *Attorney, Agent, or Firm* — Fish & Richardson P.C.

(57) ABSTRACT

The disclosure relates to an optical device, in particular for microlithography. The optical device includes an optical module and a support structure that supports the optical module. The optical module includes an optical element and a holding device that holds the optical element. The holding device includes a deformation device having a plurality of active deformation units which contact the optical element and which are designed so as to impose a pre-defined deformation on the optical element. The optical module is fixed to the support structure in a replaceable manner.

18 Claims, 7 Drawing Sheets

Related U.S. Application Data continuation of application No. PCT/EP2009/058943, filed on Jul. 14, 2009.

(60) Provisional application No. 61/080,423, filed on Jul. 14, 2008.

(58) Field of Classification Search
CPC ............... G03F 7/70883; G03F 7/7095; G03F 7/70233; G02B 7/008; G02B 7/023; G02B 7/02; G02B 17/08
See application file for complete search history.

(56) References Cited

U.S. PATENT DOCUMENTS

| | | |
|---|---|---|
| 6,803,994 B2 | 10/2004 | Margeson |
| 9,217,936 B2 | 12/2015 | Steinbach et al. |
| 2001/0033437 A1 | 10/2001 | Meehan et al. |
| 2003/0179357 A1 | 9/2003 | Ravensbergen |
| 2003/0234918 A1 | 12/2003 | Watson |
| 2003/0234989 A1 | 12/2003 | Oshino et al. |
| 2004/0008433 A1 | 1/2004 | Margeson |
| 2004/0212792 A1 | 10/2004 | Miyajima |
| 2005/0134972 A1 | 6/2005 | Kugler et al. |
| 2006/0082907 A1 | 4/2006 | Murasato |
| 2007/0014038 A1 | 1/2007 | Beck et al. |
| 2007/0076310 A1 | 4/2007 | Sakino et al. |
| 2008/0123203 A1 | 5/2008 | Onuki et al. |
| 2009/0052066 A1 | 2/2009 | Kwan et al. |
| 2009/0185148 A1 | 7/2009 | Kwan et al. |
| 2009/0207511 A1 | 8/2009 | Schoeppach et al. |
| 2009/0260654 A1 | 10/2009 | Geuppert et al. |
| 2009/0310107 A1 | 12/2009 | Sato |
| 2010/0073786 A1 | 3/2010 | Bornschein et al. |
| 2011/0299053 A1 | 12/2011 | Steinbach et al. |

FOREIGN PATENT DOCUMENTS

| | | |
|---|---|---|
| DE | 101 51 919 | 5/2003 |
| DE | 10 2006 022 957 | 11/2006 |
| DE | 10 2006 047 666 | 4/2008 |
| DE | 10 2007 058.158 | 6/2008 |
| EP | 0 964 281 | 12/1999 |
| JP | 2000-195788 | 7/2000 |
| JP | 2004-006823 | 1/2004 |
| JP | 2004-031491 | 1/2004 |
| JP | 2004-506236 | 2/2004 |
| JP | 2004-327529 | 11/2004 |
| JP | 2006-113414 | 4/2006 |
| JP | 2006-245085 | 9/2006 |
| JP | 2007-103657 | 4/2007 |
| JP | 2007-515797 | 6/2007 |
| JP | 2007-281079 | 10/2007 |
| JP | 2008-107667 | 5/2008 |
| JP | 2008-541160 | 11/2008 |
| JP | 2009-545152 | 12/2009 |
| WO | WO 2005/064404 | 7/2005 |
| WO | WO 2006/119970 | 11/2006 |
| WO | WO 2006/136352 | 12/2006 |
| WO | WO 2007/022922 | 3/2007 |
| WO | WO 2008/012336 | 1/2008 |
| WO | WO 2008/049926 | 5/2008 |

OTHER PUBLICATIONS

English translation and Japanese Office Action, for corresponding JP Application No. 2011-517893, dated Nov. 14, 2012.
The Japanese Office Action, with translation thereof, for JP Appl No. 2011-517893, dated Dec. 17, 2013.
Japanese Office Action with English Translation thereof, for corresponding JP Appln. No. 2014-116854, dated Jun. 2, 2015.
Japanese Office Action with English translation thereof for JP Appln. No. 2016-124114, dated Apr. 11, 2017.

* cited by examiner

OPTICAL DEVICE HAVING A DEFORMABLE OPTICAL ELEMENT

CROSS-REFERENCE TO RELATED APPLICATIONS

This application is a continuation of, and claims benefit under 35 USC 120 to, U.S. application Ser. No. 13/004,470, filed Jan. 11, 2011, now U.S. Pat. No. 9,217,936, which is a continuation of and claims benefit under 35 USC 120 to international application PCT/EP2009/058943, filed Jul. 14, 2009, which claims benefit of German Application No. 10 2008 032 853.7-51, filed Jul. 14, 2008 and U.S. Ser. No. 61/080,423, filed Jul. 14, 2008. U.S. application Ser. No. 13/004,470 and international application PCT/EP2009/058943 are hereby incorporated by reference in their entirety.

FIELD

The present disclosure relates to optical devices, optical imaging devices including such an optical device, a set of components for such an optical device, and a method for supporting an optical element. The disclosure may be applied in connection with any desired optical devices or optical imaging methods. In particular, it may be applied in conjunction with microlithography as used during the production of microelectronic circuits.

BACKGROUND

Apart from using components that are implemented with a level of precision as high as possible, it is desirable, particularly in the area of microlithography, to adjust the position and geometry of optical modules of the imaging device, i.e. for example of the modules having optical elements such as lenses, mirrors or gratings, but also of the masks and substrates used, during operation as precisely as possible in accordance with specified setpoint values or to keep such components in their position once adjusted, in order to achieve a correspondingly high imaging quality (whilst the term optical module, in terms of the present disclosure, is to encompass both optical elements alone and assemblies made of such optical elements and further components, such as for example frame parts etc.).

In the area of microlithography, the desired level of precision is in the microscopic range in the order of just a few manometers or less. They are not least a consequence of the constant desire to enhance the resolution of the optical systems used for the manufacture of microelectronic circuits, in order to advance the miniaturisation of the microelectronic circuits to be produced.

In this connection it is known, amongst others, from US 2003/0234918 A1 (Watson), US 2007/0076310 A1 (Sakino et al.), U.S. Pat. No. 6,803,994 B1 (Margeson), DE 198 59 634 A1 (Becker et al.) as well as DE 101 51 919 A1 (Petasch et al.), the respective disclosures of which are incorporated herein by reference, to impose pre-defined deformations on individual or a plurality of optical elements of the system, in order to correct imaging errors of the imaging device. The deformation of the optical element concerned is here not only used to correct the respective optical element itself, but rather this is done in an attempt to compensate also for errors in the wave front, which are introduced by other components of the imaging device.

What can be problematic here is that the optical elements actively deformed in order to correct imaging errors as well as the other components involved in the deformation are not only exposed during operation to the usual thermal and dynamic loads, but, as a result of the deformation, also to further, partially substantial dynamic loads. These additional loads can have a negative effect on the lifetime of the optical element or of the other components involved in the deformation. Accordingly, these components of the imaging system generally are designed to be correspondingly robust and/or complex in order to meet the desired lifetime for the overall system. Moreover, optical elements having a larger cross section usually will have to be deformed. This in turn means that the actuators used are generally designed in such a way that forces that are appropriately high for a sufficient deformation are achieved.

A further problem, for example, in connection with the system known from US 2003/0234918 A1 (Watson) is that force actuators (for example Lorentz actuators) are used to generate the deformation, which force actuators themselves have a very low rigidity in their actuation direction and moreover act on the optical element via a system that is soft in the force flux direction, so that for small deformations of the optical element, comparatively long travel ranges are generally desired. As a result, a comparatively large installation space is generally desired for the deformation device, which can be of disadvantage in the light of the usually already confined spaces available.

A further disadvantage in connection with the known imaging systems can lie in the fact that, for the deformation of the optical elements concerned, a design of the support structure for the optical element which is specially adapted for this purpose is used. This means, if there is a wish to provide, in a pre-existing or fully designed optical imaging system, an optical element that has so far not been provided with such an active deformation with a corresponding deformation facility, then this will, as a rule, involve a complete re-design of the support structure for the optical element. This may, in certain circumstances, have an effect on the entire imaging system, if it is not possible to keep the position and the orientation of the optical element unchanged within the imaging system.

A further disadvantage of the imaging systems already known for example from US 2007/0076310 A1 (Sakino et al.) can lie in the fact that a quick success of the correction of imaging errors is largely dependent on the dynamic mechanical properties of the components involved in the deformation. Here, it is in principle particularly advantageous from a dynamic point of view if, amongst other things, the support structure that supports the deformation forces is designed to be particularly rigid (ideally infinitely rigid). The reason is that, in this case, a relative independence of the actuating movements of the individual actuators will be ensured, whereas the actuating movements of an actuator in the case of a less rigid support structure result in a deformation of the support structure, which influences the position and the orientation of at least the adjacent actuators, which in turn involves a correction within their region. As a result, a very complex control concept can become desirable, which can meet the desired dynamic properties in the field of microlithography only to a limited extent.

SUMMARY

The present disclosure provides an optical device, an optical imaging device, a method for supporting the optical element and/or a set of components for an optical device, which enable in particular in a simple manner the application of an active deformation of one or more optical elements so as to achieve a rapid correction of imaging errors, in order to achieve an imaging quality that is permanently as high as possible during operation with a throughput as high as possible.

The present disclosure is on the one hand based on recognizing that an active deformation of one or more optical elements, a rapid correction of imaging errors and, thus, a particularly high imaging quality may be achieved on a permanent basis in a simple manner with a high throughput by designing the optical module including the optical element to be deformed to be replaceable in an easy manner. In the context of the present disclosure, easy replaceability is to be understood to mean, amongst other things, that optical modules can, if desired, be replaced even with just a brief interruption of the operation of the entire optical imaging device. This replaceability of the optical module allows a correspondingly simpler and/or lighter design of the optical module. Although it may then be possible that the optical module no longer achieves the desired lifetime of the overall imaging device, but this is not critical by virtue of the fact that the optical module and thus the optical element are replaceable.

The simpler and lighter design of the optical module moreover allows installation space for the connection mechanism to be freed, which ensure a simple connection and/or disconnection and thus the replaceability of the optical module, so that it becomes possible to integrate the optical module into an existing design of an optical imaging system without having to modify the connection dimensions of the remaining imaging system.

The lighter design of the optical module in turn may also have a positive effect on the dimensioning of the deformation device of the optical module, which deforms the optical element. As a result it becomes advantageously possible to integrate such an optical module having an actively deformable optical element within a confined installation space. In particular it is even possible in the case of a specified design of the imaging system, to use such an active module instead of the former passive module (without such an active deformation of the optical element), without having to (substantially) modify the remaining design of the optical imaging system.

According to a first aspect, the present disclosure therefore relates to an optical device, in particular for microlithography, which includes an optical module and a support structure, the support structure supporting the optical module. The optical module includes an optical element and a holding device, the holding device holding the optical element. The holding device includes a deformation device having a plurality of active deformation units which contact the optical element and which are designed to impose a pre-defined deformation on the optical element. The optical module is fixed to the support structure in a replaceable manner.

According to a further aspect, the present disclosure relates to a method for supporting an optical element, in particular for microlithography, wherein the optical element is held by a holding device of an optical module and the optical module is supported by a support structure, with a pre-defined deformation being imposed on the optical element by a plurality of active deformation units and the optical module being held by the support structure in a replaceable manner.

According to a further aspect, the present disclosure relates to a set of components for an optical device, in particular for microlithography, including an optical module and a support structure, the support structure supporting the optical module in a first condition of the optical device. The optical module includes an optical element and a holding device, the holding device holding the optical element. The holding device includes a deformation device having a plurality of active deformation units which contact the optical element and which are designed to impose a pre-defined deformation on the optical element. The optical module is fixed to the support structure in a replaceable manner via at least one supporting point. Further, an optical replacement module is provided, the optical replacement module being designed to take the place of the optical module in a second condition of the optical device and to be fixed to the support structure via the at least one supporting point.

The present disclosure is further based on recognizing that it is particularly advantageous to use actuators for the deformation of the optical element, which have a high rigidity in their actuation direction (i.e. in the direction in which they generate a force or a momentum). This design has the advantage that actuators having such rigidity as a rule have a compact size and, if appropriate, short travel ranges with a high resolution of the travel range, so that the deformation device only involves a comparatively small installation space. As has already been explained above, this makes it possible to integrate such an optical module having an actively deformable optical element within a confined installation space. In particular it is even possible, with a specified design of the imaging system, to use such an active module instead of the former passive module (without such an active deformation of the optical element), without having to (substantially) modify the remaining design of the optical imaging system.

In this connection it is particularly advantageous to implement the structure that supports the respective deformation device also to be as rigid as possible, in order to keep any mutual influences amongst the individual deformation devices and, thus, the complexity of the control of the active deformation of the optical element as low as possible. However, it will be understood that in certain variants of the disclosure it may also be provided for a correspondingly complex control system to be realised, which compensates for these mutual influences via a suitable control concept and a sufficient control bandwidth.

According to a further aspect, the present disclosure therefore relates to an optical device, in particular for microlithography, including an optical module and a support structure, the support structure supporting the optical module. The optical module includes an optical element and a holding device, the holding device holding the optical element. The holding device includes a deformation device having a plurality of active deformation units which contact the optical element and which are designed to impose a pre-defined deformation on the optical element via a deformation force in a deformation force direction. The holding device further includes a positioning device including at least one, in particular active, positioning unit which contacts the optical element and which is designed to adjust the position and/or the orientation of the optical element. At least one of the deformation units includes an actuator unit for generating the deformation force, with the actuator unit generating a force or a momentum in an actuation direction and having a high rigidity in the actuation direction.

According to a further aspect, the present disclosure relates to a method for supporting an optical element, in particular for microlithography, wherein the optical element is held by a holding device of an optical module and the optical module is supported by a support structure, the optical element being contacted by a plurality of active deformation units of a deformation device of the holding device and each deformation unit imposing a pre-defined deformation on the optical element via a deformation force in a deformation force direction. The optical element is contacted by at least one positioning unit of the holding device, the at least one positioning unit adjusting the position and/or the orientation of the optical element. The respective deformation force is generated by an actuator unit of the deformation units, the actuator unit generating a force or a momentum in an actuation direction and having a high rigidity in the actuation direction.

The present disclosure is further based on recognizing that a simple integration of an active deformation of one or more optical elements with the advantages resulting therefrom is also possible with a pre-existing design of the imaging system, if a deformation device having a separate (from the holding structure of the respective optical element) abutment structure is provided which on the holding structure of the respective optical element. As a result, it is in particular possible to retrofit such a deformation device in a simple manner, without having to carry out any significant modifications to the optical element of our holding structure.

According to a further aspect, the present disclosure relates to an optical device, in particular for microlithography, including an optical element and a holding device, the holding device having a holding structure that holds the optical element. The holding device includes a deformation device having a plurality of active deformation units which contact the optical element and which are designed to impose a pre-defined deformation on the optical element. The deformation device has an abutment structure that is separate from the holding structure, the abutment structure being fixed, in particular in a detachable manner, to the holding structure and at least one of the deformation units being supported on the abutment structure.

According to a further aspect, the present disclosure relates to a method for supporting an optical element, in particular for microlithography, wherein the optical element is held by a holding structure of a holding device and a pre-defined deformation is imposed on the optical element by a plurality of active deformation units of a deformation device of the holding device. To this end, an abutment structure of the deformation device, which is separate from the holding structure, is fixed, in particular in a detachable manner, to the holding structure and at least one of the deformation units is supported on the abutment structure.

Finally, the present disclosure is based on recognizing that the desired active deformation may be realised by an active deformation device of a particularly compact design, which may optionally be integrated into an existing design of the imaging system in a simple manner, if a separate measuring device is provided which measures the deformation of the optical element. By using such a measuring device it becomes possible, amongst other things, to impose displacements instead of forces on the optical element concerned by the deformation units of the deformation device. Although the desired control algorithm becomes more complex as a result of the mutual influences of the individual deformation units, which are inherent to such a solution (a displacement generated by one of the deformation units entails another displacement at least in the region of adjacent deformation units), but the measuring device enables such a control to be realised with a sufficient control bandwidth.

According to a further aspect, the present disclosure therefore relates to an optical device, in particular for microlithography, including an optical element and a holding device, the holding device including a holding structure that holds the optical element, in particular in a statically determined manner. The holding device includes a deformation device having a plurality of active deformation units which contact the optical element and the holding structure and which are designed so as to impose a pre-defined deformation into the optical element. Further, a measuring device is provided which includes a reference structure connected to the holding structure and at least one measuring unit, with the at least one measuring unit being designed so as to detect a measurement value representative of the geometry of the optical element, in particular a measurement value representative of a distance between the reference structure and a measuring point of the optical element. The measuring device is designed so as to determine, using the first measurement value, a detection value representative of a deformation of the optical element.

According to a further aspect, the present disclosure finally relates to a method for supporting an optical element, in particular for microlithography, wherein the optical element is held, in particular in a statically determined manner, by a holding structure of a holding device and a pre-defined deformation is imposed into the optical element by a plurality of active deformation units of a deformation device of the holding device. By at least one measuring unit of a measuring device connected to the holding structure, a measurement value representative of the geometry of the optical element, in particular a measurement value representative of a distance between the reference structure and a measuring point of the optical element, is detected, the measuring device determining, using the first measurement value, a detection value representative of a deformation of the optical element.

Further preferred embodiments of the disclosure will become evident from the dependent claims and from the following description of preferred embodiments, respectively, wherein reference is made to the attached drawings.

DETAILED DESCRIPTION OF THE DISCLOSURE

First Embodiment

With reference to FIGS. 1 to 5, a preferred embodiment of the optical device according to the disclosure will be described below, which is used in an optical imaging device according to the disclosure in the area of microlithography.

Figure 1:
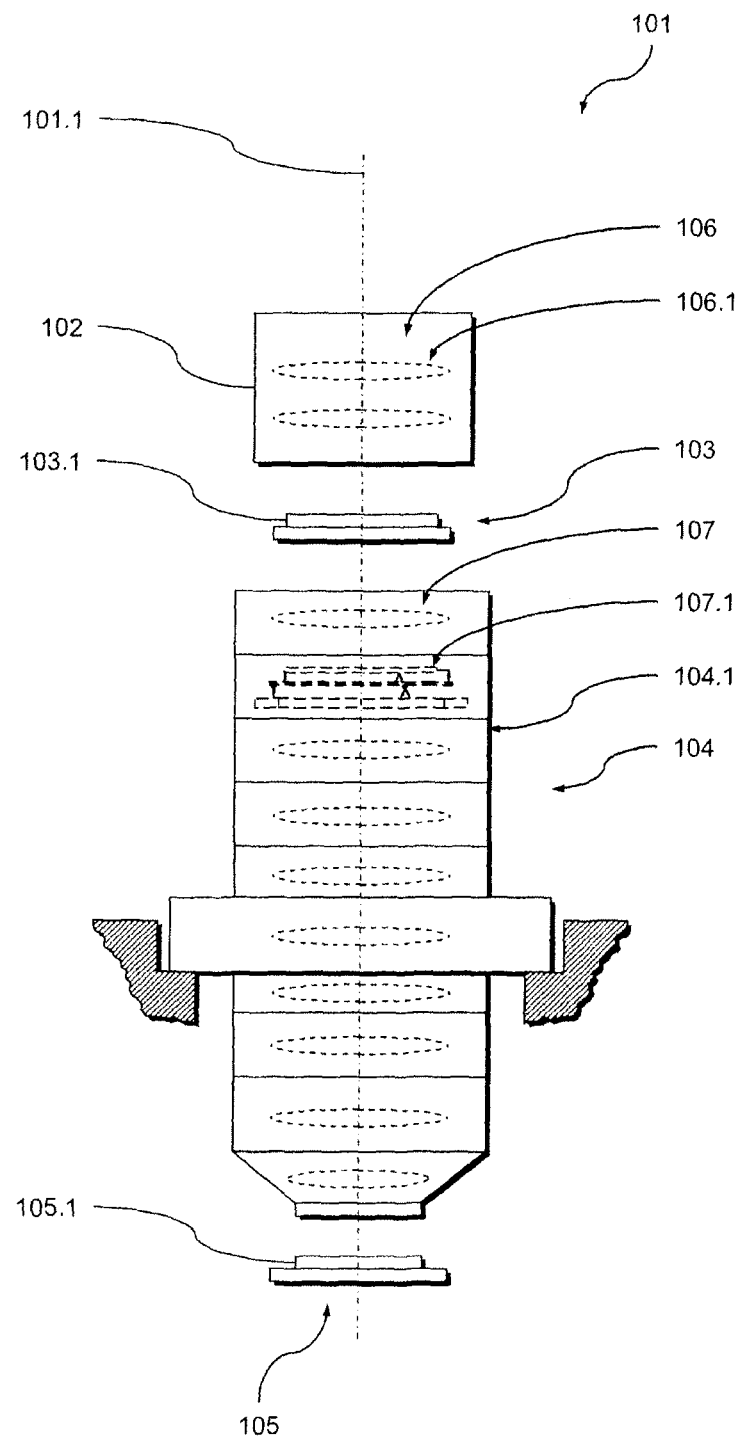
FIG. 1 shows a schematic illustration of a preferred embodiment of the optical imaging device according to the disclosure, which includes an optical device according to the disclosure and by which a preferred embodiment of a method according to the disclosure for supporting an optical element can be carried out.

FIG. 1 shows a schematic illustration of a preferred embodiment of the optical imaging device according to the disclosure in the form of a microlithography apparatus 101 that works with light in the UV range with a wavelength of 193 nm.

The microlithography apparatus 101 includes an illumination system 102, a mask device in the form of a mask table 103, an optical projection system in the form of an objective 104 and a substrate device in the form of a wafer table 105. The illumination system 102 illuminates a mask 103.1 placed on the mask table 103 via a projection light beam (not shown in more detail) having a wavelength of 193 nm. On the mask 103.1, a projection pattern is located which is projected via the projection light beam via the optical elements arranged in the objective 104 onto a substrate in the form of a wafer 105.1 that is placed on the wafer table 105.

Apart from a light source (not shown), the illumination system 102 includes a group 106 of optically active components, which includes, amongst other things, a number of optical elements, for example the optical element 106.1. Further, the objective 104 includes a further group 107 of optically active components, which includes a number of optical elements, for example the optical element 107.1 which is shown in FIGS. 1 to 4 in a highly schematic form (as a plate with parallel faces). In the present example with a working wavelength of 193 nm, the optical elements 106.1, 107.1 are refractive optical elements. However, it will be understood that in other variants of the disclosure (in particular with other working wavelengths), also refractive, reflective or diffractive optical elements (having optical surfaces of any desired design) may be used either alone or in arbitrary combinations.

The optically active components of the optical groups 106 and 107 define an optical axis 101.1 of the microlithography apparatus 101, which in the present example is formed to be rectilinear. However, it will be understood that in other variants of the disclosure, the optical axis may also be chosen to have an arbitrarily kinked or folded course.

Figure 2:
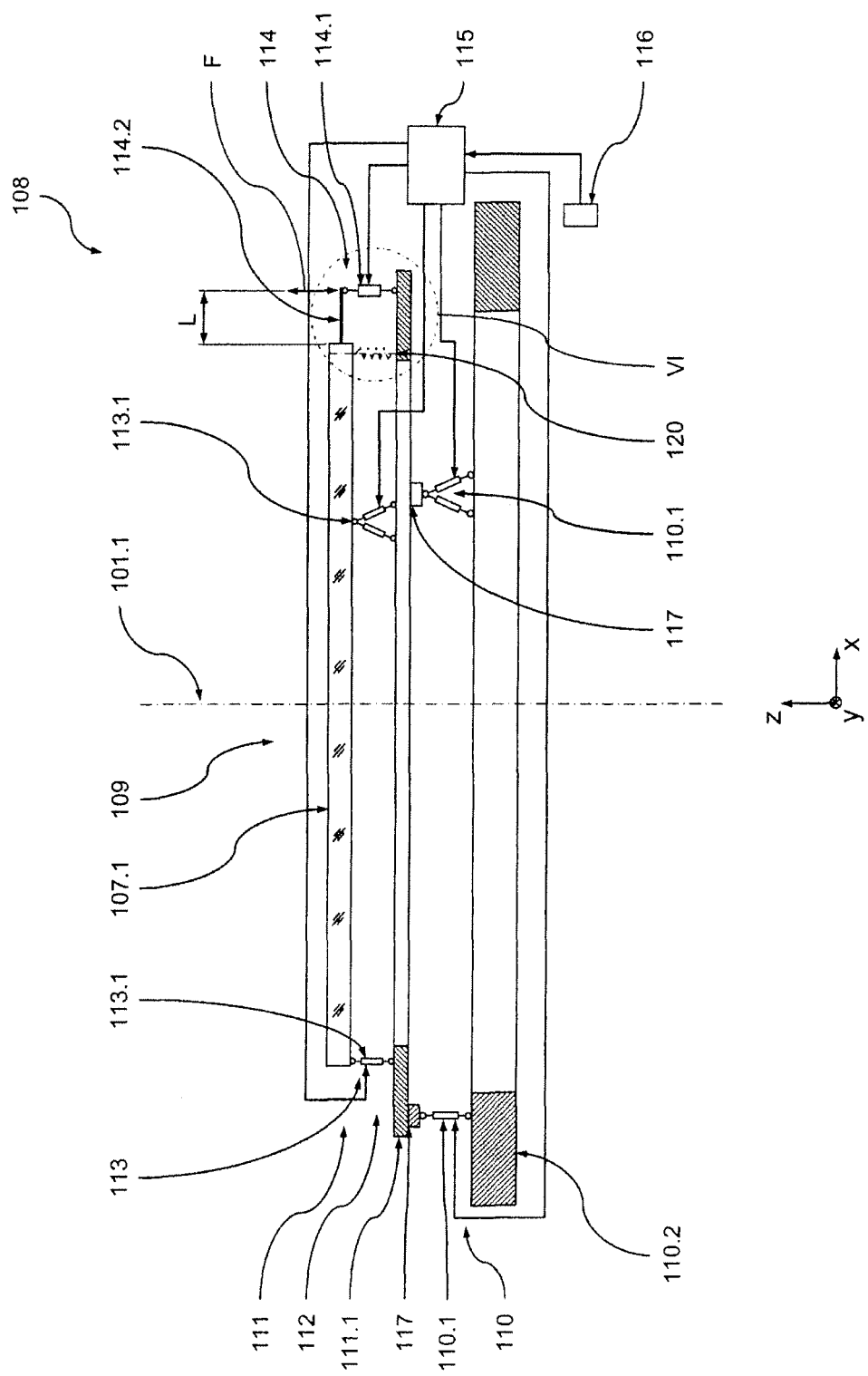
FIG. 2 shows a schematic sectional view of a preferred embodiment of the optical device according to the disclosure of the optical imaging device of FIG. 1.

The optically active components of the group 107 are held in the housing 104.1 of the objective 104 in appropriate optical devices. FIG. 2 shows a highly schematic illustration of an optical device 108 according to the disclosure, which includes an optical module 109 and a support structure 110.

The support structure 110 is connected to the housing 104.1 of the objective 104 and supports the optical module 109. To this end, the support structure 110 includes (optionally in addition to further support elements) a number of support units 110.1 that are connected to a support ring 110.2 and to the optical module 109. The support ring 110.2 is rigidly connected to the housing 104.1 of the objective 104 or is a component of the housing 104.1.

The optical module 109 includes a holding device 111 that holds the optical element 107.1. To this end, the holding device 111 again includes a holding structure in the form of a holding ring 111.1, on which a plurality of holding units 112 is supported. The holding units 112 are connected to the optical element 107.1. In the present example, the holding units 112 engage directly on the optical element 107.1. However, it will be understood that in other variants of the disclosure it may also be provided that one or more further intermediate elements are arranged between a part of the holding units and the optical element, for example a further (inner) holding ring, so that the force flux between the optical element and the holding units concerned takes place via the intermediate element concerned.

In the present example, one part of the holding units 112 is implemented as a positioning device having a plurality of positioning units 113, whilst the other part of the holding units 112 is implemented as a deformation device having a plurality of deformation units 114.

The positioning units 113 are designed in such a way (as will be explained in more detail below) that they are primarily used for adjusting the position and/or the orientation of the optical element 107.1 in space. The positioning units 113 may be (at least partially) passive components which are designed to be correspondingly adjustable, in order to adjust the position and/or the orientation of the optical element 107.1 (either once only or from time to time).

Preferably, the positioning units 113 are (at least partially) active components which allow the position and/or the orientation of the optical element 107.1 to be actively adjusted during the operation of the microlithography apparatus 101. For this purpose, the respective positioning unit 113 includes one or more active positioning elements 113.1 (for example generally known actuators) which can be appropriately controlled by a control device 115.

On the other hand, the deformation units 114 (as will be explained in more detail below) are designed in such a way that they are primarily used for adjusting the geometry of the optical element 107.1. In other words, the deformation units 114 are designed so as to specifically impose a pre-defined deformation on the optical element 107.1 in order to correct at least partially any imaging errors of the optical element 107.1 and/or of one or more other optical elements of the microlithography apparatus 101, as this is known for example from US 2003/0234918 A1 (Watson) which was mentioned in the beginning. For this purpose, the deformation units 114 are connected to the control device 114 that transmits corresponding control signals to the deformation units 114. The control device 115 in turn determines these control signals using the detection signals from a detection unit 116 connected to the control device 115. Via the detection unit 116, the current value of one or more variables is determined in a manner generally known, which variable(s) is or are representative of the current value of the respective imaging error to be corrected.

By this approach it is possible to carry out, during the operation of the microlithography apparatus 101, via the active deformation of the optical element 107.1, an (at least partially) active correction of one or more imaging errors which occur during imaging of the projection pattern of the mask 103.1 onto the substrate 105.1. In doing so, a sufficiently high control bandwidth may be achieved, which does not introduce any delays into the imaging process and therefore does not have a negative effect on the throughput of the microlithography apparatus 101.

As can be seen from FIG. 2, in the present example, three support units 110.1 are provided in the area of three first supporting points, which support units are evenly distributed over the circumference of the optical module 109. In the present example, the support units 110.1 are each designed in the style of a bipod, so that the support thus achieved of the optical module 109 is formed in the manner of a hexapod, via which a statically determined support of the optical module 109 (having a certain natural frequency) is realised.

However, it will be understood that, in other variants of the disclosure, any other desired support of the optical module may be selected. Preferably, however, this will as a rule be a statically determined support in order to avoid as far as possible any undesired deformation of the optical module.

In the present example, the optical module 109 is connected to the support units 110.1 of the support structure 110 in an easily detachable and thus replaceable manner via connecting units 117. In the present example, the easy replaceability is, amongst other things, ensured by virtue of the fact that the connection between the optical module 109 and the support units 110.1 can be released in a simple manner without affecting the remaining structural integrity of the objective 104 or the fixed structural or spatial relationship existing after the assembly of the objective 104 between the remaining optical elements of the optical group of elements 107.

This may be realised by the fact that, on the one hand, the connecting units 117 are correspondingly easily accessible for releasing or later re-establishing the connection and, on the other hand, the optical module 109 can be taken out of the objective housing 104.1, without affecting the spatial relationship between the other optical elements of the objective 104.

As a result it is possible to design the optical element 107.1 to be correspondingly simple and lighter than in previous solutions with such an active deformation. This is a result of the fact that both the optical element 107.1 and the remaining components of the optical module 109 do not need to be adapted to the lifetime of the objective 104 and/or the microlithography apparatus 101. Rather, by virtue of the easy replaceability it is possible to use components of a simpler and lighter design, which are easily replaced once they reach the end of their lifetime.

These relaxed lifetime properties for the components of the optical module 109 also make it possible to use for the positioning units 113 and the deformation units 114, on the one hand, an element for the optical element 107.1, the cross section of which is designed to be correspondingly thin, and, on the other hand, components that are designed to be correspondingly light and thus smaller also. Consequently, the optical module 109 may be accommodated within a comparatively small space. Accordingly, it may now optionally even be possible to realise such an active deformation in an existing design of the objective 104, which previously didn't provide for an active deformation in the area of the optical element 107.1, without having to modify the design of the optical imaging system (in particular the distances between the optical elements of the element group 107 along the optical axis 101.1).

In the present example, the connecting units 117 are arranged at the end of the respective support unit 110.1, which faces the optical module 109. However, it will be understood that in other variants of the disclosure it may also be provided that the respective connecting unit is mounted in the central area of the associated support unit or on the end of the support unit, which faces away from the optical module. This means in other words that it is also possible to replace at least part of the respective support unit together with the optical module.

Figure 3:
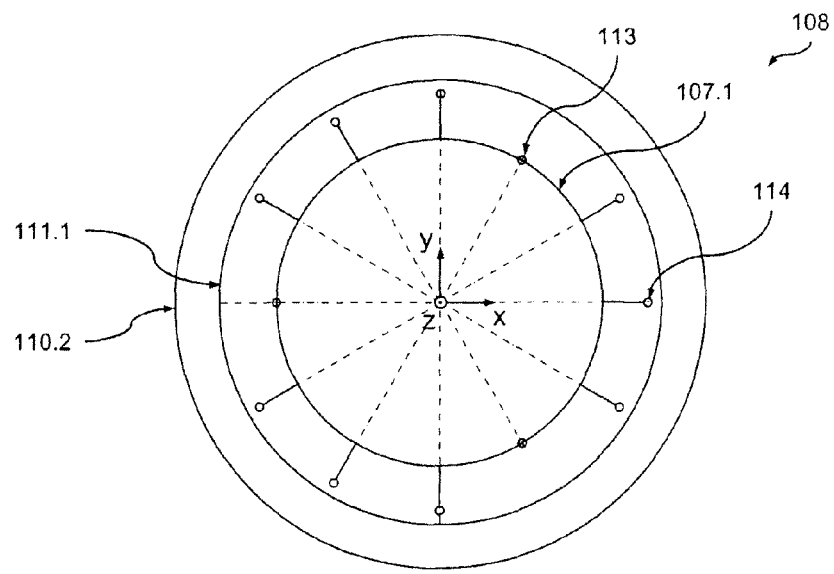
FIG. 3 shows a highly schematic top view of the optical device of FIG. 2.

As can be seen from FIG. 3, in the present example, three positioning units 113 are provided which are evenly distributed over the circumference of the optical element 107.1. In the present example, the positioning units 113 are respectively designed in the manner of a bipod, so that the positioning device thus formed is altogether formed in the manner of a hexapod, via which (in principle) a statically determined support of the optical element 107.1 (having a certain natural frequency) is realised.

The deformation units 114 are evenly distributed between the positioning units 113 over the circumference of the optical element 107.1, so that an altogether even distribution of the holding units 112 over the circumference of the optical element 107.1 is achieved.

As can be seen from FIG. 2, the deformation units 114 are each formed by an actuator unit 114.1 supported on the holding ring 111.1 and by an elastic lever arm 114.2 as the transmission element. One end of the elastic lever arm 114.2 is rigidly fixed to the circumference of the optical element 107.1, whilst the elastic lever arm 114.2 is connected to the actuator unit 114.1 in the area of the other end thereof. The actuation direction of the actuator unit 114.1 (i.e. the direction in which the actuator unit 114.1 develops its primary force effect F), in a neutral condition (without any force effect by the actuator unit 114.1), extends perpendicularly to the longitudinal axis of the lever arm 114.2. The force effect or motion transmission between the actuator unit 114.1 and the point of action of the deformation unit 114 on the optical element 107.1 may be adjusted via the length L and the bending stiffness of the lever arm 114.2.

Figure 4:
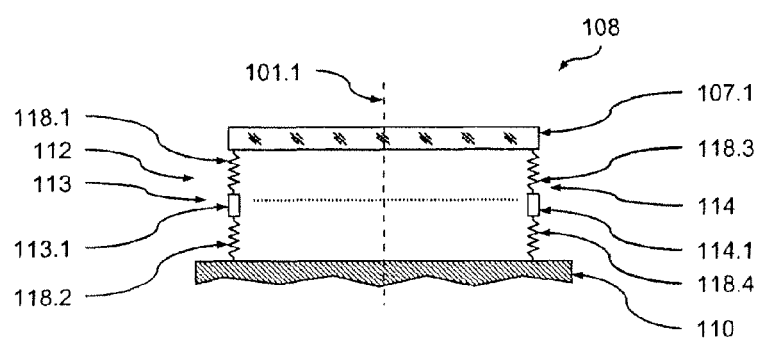
FIG. 4 shows a mechanical equivalent circuit diagram of the optical device according to the disclosure.

FIG. 4 shows a mechanical equivalent circuit diagram of the optical module 109, in which the various sections of the optical module 109 are represented by simplified equivalent components. Thus, the section between the respective $i^{th}$ positioning element 118.1 and the optical element 107.1 is represented by a simple spring 118.1 of a first rigidity $C1i$, whilst the section between the positioning element 113.1 and the support structure 110 is represented by a spring 118.2 of a second rigidity $C2i$. In this equivalent system, the support structure 110 is assumed in good approximation as having an infinite rigidity.

A comparable approach is also chosen for the deformation units 114, wherein for the $j^{th}$ deformation unit 114, the section between the respective actuator unit 114.1 and the optical element 107.1 is represented by a simple spring 118.3 of a third rigidity $C3j$, whereas the section between the actuator unit 114.1 and the support structure 110 is represented by a spring 118.4 of a fourth rigidity $C4j$.

It is to be noted at this point that the rigidities $C1i$ to $C4j$ are respectively equivalent rigidities for the rigidities in the direction of the (main) load (i.e. a force and/or a momentum) present (upon actuation) on the respective component. These equivalent rigidities may therefore be the calculated rigidity of the transmission element 114.2 which results at the location of the actuator unit 114.1 in the actuation direction F, or the calculated rigidity of the holding ring 111.1 related to the location of the actuator unit 114.1.

In other words, the respective equivalent rigidity is a (calculated) rigidity that is related to the location of the actuator unit 114.1 or of the positioning element 113.1, which is determined at the location of the actuator unit 114.1 or of the positioning element 113.1 (in the acting direction of the actuator unit 114.1 or of the positioning element 113.1) from the active load (of the actuator unit 114.1 or of the positioning element 113.1) and from that displacement that is obtained:

(i) at the location of the actuator unit 114.1 or of the positioning element 113.1,
(ii) under the active load acting at the location of the actuator unit 114.1 or of the positioning element 113.1;
(iii) from the deformation (effected by the active load) of the respective component (for which the reference rigidity was determined).

In the present example, the i (=3) positioning units 113 are formed to be as rigid as possible in the direction of the force flux (that acts therein as they support the optical element 107.1), i.e. the respective first and second rigidities C1$i$ and C2$i$ are chosen to be as high as possible so as to achieve the position and the orientation of the optical element 107.1 to be established with a predeterminable high natural frequency. The actual rigidity of the component is therefore determined by the desired natural frequency of the support. To this end, on the one hand, the respective connection between the positioning element 113.1 and the optical element 107.1 is implemented to be correspondingly rigid. Further, on the other hand, the connection between the positioning element 113.1 and the holding ring 111.1 is implemented to be correspondingly rigid. Finally, the support by the holding ring 111.1 itself is implemented to be as rigid as possible in this area.

In order to keep the effort for stiffening the holding ring 111.1 as low as possible, it is provided in the present example that the respective positioning unit 113 is positioned at a second supporting point which in turn is located in the area of the first supporting point, where the optical module 109 is supported on the support structure, so that the effect of the rigidity of the holding ring 111.1 on the rigidity of the support of the optical module 109 is kept low.

The rigidity of the holding ring 111.1 in the area of the second supporting point, which is related to the location of the positioning element 113.1, corresponds in the present example to at least the rigidity of the positioning element 113.1 in the acting direction thereof.

However, it will be understood that, in other variants of the disclosure, it may also be provided that the rigidity of the holding ring 111.1, which is related to the location of the positioning element 113.1, corresponds to at least 5% to 10% of the rigidity of the positioning element 113.1 in the acting direction thereof. Thus, the positioning element 113.1 may also be more rigid than the holding ring 111.1. In particular, the rigidity of the positioning element 113.1 may significantly exceed the rigidity of the holding ring 111.1, which is related to the location of the positioning element 113.1 (it may optionally even amount to ten to twenty times the rigidity of the holding ring 111.1, which is related to the location of the positioning element 113.1).

However, it will be understood that, in further variants of the disclosure, it may also be provided that the rigidity of the holding ring 111.1, which is related to the location of the positioning element 113.1, is greater than the rigidity of the positioning element 113.1. In these cases, the rigidity of the holding ring 111.1, which is related to the location of the positioning element 113.1, preferably amounts to up to 150%, preferably to up to 200% of the rigidity of the positioning element 113.1 in the acting direction thereof. Thus, the holding ring 111.1 may also be more rigid than the positioning element 113.1.

In the present example, the respective positioning element 113.1 itself also has a high rigidity in its acting direction (and thus in the direction of the force flux), and this may be any desired suitable actuator that has appropriate mechanical properties and has a sufficient adjustment range.

By contrast, in the present example the j (=9) deformation units 114 are implemented to be as soft as possible (i.e. at least one of the respective third and fourth rigidities C3$j$ and C4$j$ is selected to be significantly lower especially by comparison with the first and second rigidities C1$i$ and C2$i$) in the direction of the load flow (which acts therein as they support the optical element 107.1) (i.e. the force flux and/or the momentum flux), in order to achieve an impact as small as possible of the shape function FD$j$ from rigidities other than that of the optical element 107.1 for the respective deformation unit 114.

The shape function FD$j$ identifies, in terms of the present disclosure, the deformation response of the optical element 114 to a pre-defined (normalised) displacement and/or a pre-defined (normalised) load effect (force effect and/or momentum effect) in the area of the actuator unit 114.1, optionally after subtraction of the rigid body movements of the optical element 107.1, which may be adjusted by the three positioning elements 113.1. If the shape function is only dependent on the rigidity of the optical element 107.1, it may be determined in advance for each actuator position in a simple manner (e.g. analytically).

Depending on the design of the deformation units 114, these loads may be a pure momentum, a pure force or a combination of force and momentum. If in the present example a linearly acting actuator is used for the actuator unit 114.1, both a momentum (about an axis extending tangentially relative to the circumferential direction of the optical element 107.1) and a force (substantially parallel to the optical axis 101.1) is introduced into the optical element via the elastic lever arm 114.2. However, it will be understood that in other variants of the disclosure it may be provided, amongst other things, that the actuator unit only introduces a momentum into the lever arm and thus into the optical element.

In the case of the above-described simple determination of the shape function FD$j$ between the individual deformation units 114 it is advantageously possible to adjust, in sufficiently good approximation, a pre-defined deformation of the optical element 107.1 via a simple control without a complex control algorithm, provided the shape function FD$j$ is known. The shape function FD$j$ may here have been determined in advance theoretically (for example appropriate simulation calculations) and/or experimentally (for example by appropriate measurements) and may have been deposited in the control device 115 as a corresponding model.

Preferably, the third rigidity C3$j$ is selected to be particularly small compared to the fourth rigidity C4$j$, in order to keep any disturbance of the shape functions FD$j$ by the rigidities C4$j$ in the individual deformation units 114 low. In this case, the desired properties with regard to the fourth rigidity C4$j$, in particular the amount of rigidity of the holding ring 111.1 that is introduced therein, are low. Thus, in this case the holding ring 111.1 does not need to be implemented to be particularly rigid, which has a positive effect on the installation space desired for the optical module 109.

Preferably, the ratio between the third rigidity C3$j$ and the fourth rigidity C4$j$ is selected such that (in the respective load direction) the fourth rigidity C4$j$ amounts to at least 500 times, preferably at least 100 times the fourth rigidity C3$j$. As a result, a particularly favourable, low disturbance of the shape function FD$j$ may be achieved.

In a case with a third rigidity C3$j$ that is small compared to the fourth rigidity C4$j$, a simple displacement actuator may be used for the actuator unit 114.1, which generates a pre-defined displacement in its acting direction as a function of a pre-defined control signal. By this, a control of a particularly simple design may be realised, since by such displacement actuators, the specification (and checking) of a pre-defined travel range can as a rule be carried out in a very simple manner. Depending on the type of actuator used, for example, only a simple specification and/or counting of the revolutions of the actuator or the like is involved.

With respect to the rigidity of the actuator unit 114.1 it is to be noted that the third rigidity $C3j$, i.e. the rigidity of the elastic lever arm 114.2 (as the transmission element between the actuator unit 114.1 and the optical element 107.1), which is related to the location of the respective actuator unit 114.1, is preferably significantly smaller in the actuation direction of the respective actuator unit 114.1 than the rigidity of the actuator unit 114.1 in its actuation direction. Preferably, the rigidity of the elastic lever arm 114.2, which is related to the location of the actuator unit 114.1, amounts to no more than 0.1% of the rigidity of the actuator unit 114.1 in the actuation direction thereof.

The actuator unit 114.1 in turn is preferably a unit that has (similar to the positioning element 113.1) a comparatively high rigidity in its acting or actuation direction. In particular, the rigidity of the actuator unit 114.1 and the rigidity of the holding ring 111.1 may in turn be matched to each other in such a way that, in the present example, the rigidity of the holding ring 111.1 (in the area of the point of action of the respective deformation unit 114), which is related to the location of the actuator unit 114.1, approximately corresponds to the rigidity of the actuator unit 114.1 in the acting direction thereof.

However, it will be understood that, in other variants of the disclosure, it may also be provided that the rigidity of the holding ring 111.1, which is related to the location of the actuator unit 114.1, corresponds to at least 5% to 10% of the rigidity of the positioning element 113.1 in the acting direction thereof. Thus, the actuator unit 114.1 may also be more rigid than the holding ring 111.1. In particular, the rigidity of the actuator unit 114.1 may significantly exceed the rigidity of the holding ring 111.1 (it may optionally even amount to ten to twenty times the rigidity of the holding ring 111.1), which is related to the location of the actuator unit 114.1.

However, it will be understood that, in further variants of the disclosure, it may also be provided that the rigidity of the holding ring 111.1, which is related to the location of the actuator unit 114.1, may also be greater than the rigidity of the actuator unit 114.1. In these cases, the rigidity of the holding ring 111.1, which is related to the location of the actuator unit 114.1, preferably amounts to up to 150%, preferably to up to 200%, of the rigidity of the actuator unit 114.1 in the acting direction thereof. Thus, the holding ring 111.1 may also be more rigid than the actuator unit 114.1.

In other variants of the disclosure, the actuator unit 114.1 may also be a force actuator that generates a pre-defined force in the acting direction thereof as a function of a pre-defined control signal. In this case there is the advantage that the rigidity of the support of the actuator unit 114.1 on the side of the support structure and/or the design of the holding ring 111.1 is almost free, because it has no significant influence on the shape function FDj by virtue of the pre-defined force effect of the actuator unit 114.1.

In both cases it will always be of advantage if the variance of the third rigidity $C3j$ is as low as possible so as to achieve an altogether minor disturbance of the shape functions FDj.

In the present example, the effect of a deformation of the holding ring 111.1, which is due to the actuation of the deformation units 114, on the position and/or the orientation of the optical element 107.1 is reduced. However, it will be understood that in other variants of the disclosure, where no such arrangement of the positioning units in the immediate vicinity of the support units exists, a simple correction of a modification of the position and/or the orientation of the optical element, which results from the active deformation, can be achieved via the positioning units 113.

In the present example, the support units 110.1 are designed as active units, via which the position and/or the orientation of the optical module 109 can be modified. To this end, the support units 110.1 are in any case connected to the control device 115 by which they are, if desired, appropriately controlled. For the support units 110.1, any desired suitable actuators may be used that enable a corresponding active adjustment to be carried out.

Herewith it is possible, amongst other things, to realise coarser or greater modifications of the position and/or the orientation of the optical module 109 and thus of the optical element 107.1, as are involved for example for rapid changes of the so-called setting of the optical imaging system, whilst the fine adjustment of the position and/or orientation of the optical element 107.1 is carried out via the positioning units 113 and the fine adjustment of the geometry of the optical element 107.1 is carried out via the deformation units 114.

By this approach it is further possible to move the optical module 109 optionally into a replacement position (which is different from an operating position during the exposure of the substrate 105.1), in which the connecting units 117 may be released in a simple manner and the optical module 109 may be removed from the objective 104 in a simple manner.

However, it will be understood that in other variants of the disclosure, the support units may also be formed at least partially as passive elements. Here, of course, also a manual adjustability for the support units may be provided.

In the present example, an adjustment of the position/orientation of the optical element 107.1 and, in particular, a correction of the imaging errors of the imaging system may be realised via an active deformation of the optical element 107.1 in the following way during the operation of the microlithography device 101.

Figure 5:
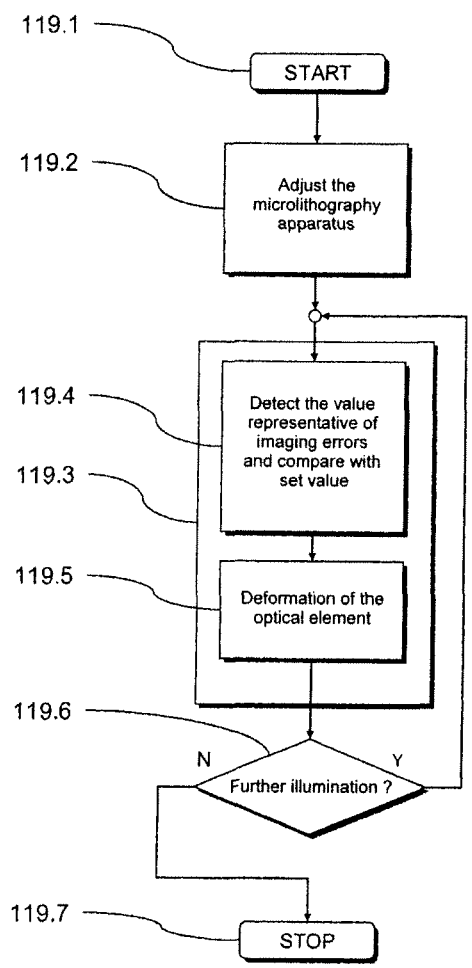
FIG. 5 shows a block diagram of a preferred embodiment of the method according to the disclosure for supporting an optical element, which can be implemented using the optical device of FIG. 2.
Figure 7:
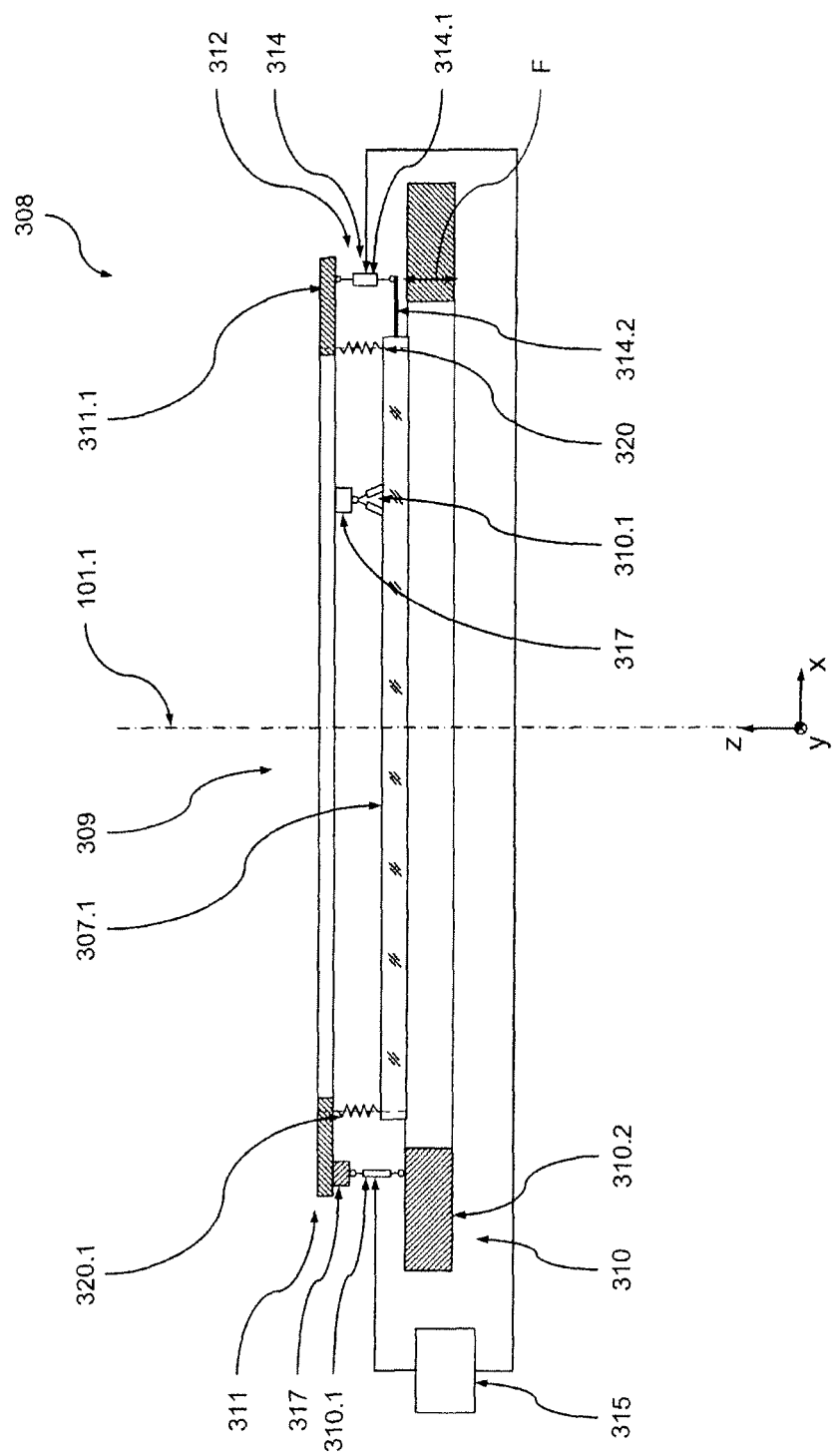
FIG. 7 shows a schematic sectional view of a further preferred embodiment of the optical device according to the disclosure of the optical imaging device of FIG. 1.
Figure 8:
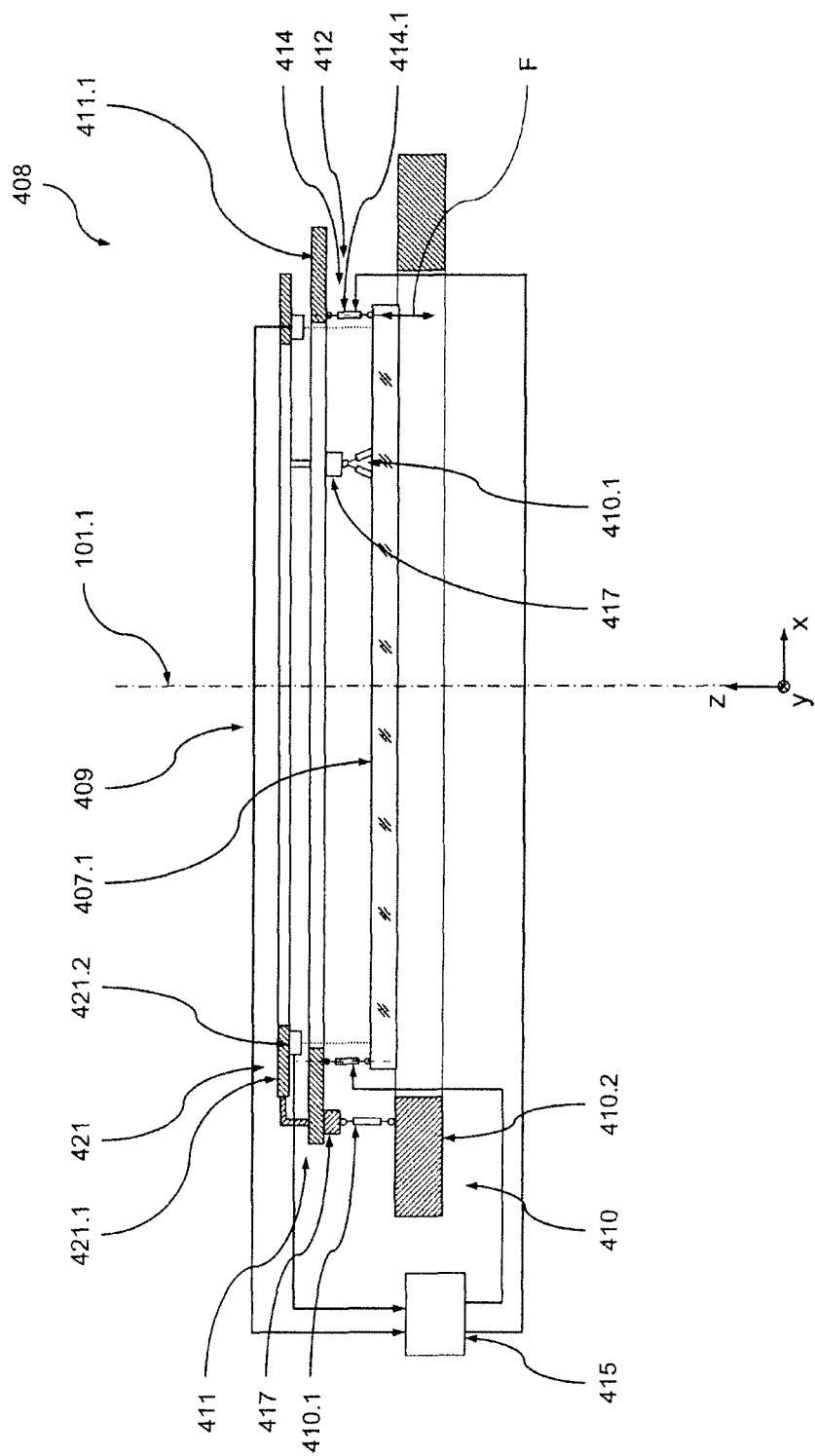
FIG. 8 shows a schematic sectional view of a further preferred embodiment of the optical device according to the disclosure of the optical imaging device of FIG. 1.

FIG. 5 shows a flow chart of an imaging process that is carried out using the microlithography apparatus 101 and wherein a preferred embodiment of the method according to the disclosure for supporting an optical element is applied.

Initially, the process is started in a step 119.1. In a step 119.2, the components of the microlithography apparatus 101 of FIG. 1 are then moved into a condition in which the above-described imaging of the projection pattern of the mask 103.1 onto the substrate 105.1 may be carried out.

In an imaging step 119.3, the above-described detection of the current value of the at least one variable representative of an imaging error of the optical imaging system is carried out at the same time as the exposure of the substrate 105.1 in a step 119.4 via the detection device 116 and the forwarding of the detected value of this variable to the control device 115.

In this step 119.4, the currently detected value of this variable is then compared in the control device 115 with a predetermined setpoint value for this variable for the current operating condition of the microlithography apparatus 101. From this comparison, the control device 115 determines, on the one hand, a specification for the geometry of the optical element 107.1, i.e. a specification for the deformation of the optical element 107.1, and determines therefrom, on the one hand, control signals for the actuator units 114.1 of the deformation units 114.

Moreover, the control device 115 determines from this comparison a specification for the position and/or the orientation of the optical element 107.1 and determines therefrom control signals for the positioning elements 113.1 of the positioning units 113. Optionally here, a modification to be expected of the position and/or the orientation of the optical element 107.1, which results from the force effect of the deformation units 114 which is to be adjusted, will be taken into account. To this end, the control device 115 can access a stored model (which was previously determined theoretically and/or experimentally) of the optical module 109, which represents the modification to be expected of the position and/or the orientation of the optical element 107.1 as a function of the force effect of the positioning element 113.1.

Optionally, the control device 115 determines from the aforementioned comparison and/or on the basis of another specification from the imaging process to be carried out also a specification for the position and/or the orientation of the optical module 109 and thus also of the optical element 107.1 and determines therefrom control signals for the support units 110.1.

In a step 119.5, the control device 115 then, in the manner described above, controls the actuator units 114.1 of the deformation units 114, the positioning elements 113.1 of the positioning units 113 and optionally the support units 110.1 using the determined control signals, in order to counteract any deviation of the current condition of the optical module 109, in particular of the optical element 107.1, from a setpoint condition that was specified for the present operating condition, in particular to counteract a currently present imaging error.

Here, the low rigidity of deformation units 114 in the load direction has the advantage that a correction of the position and/or the orientation of the optical element 107.1 via the positioning units 113 only entails a comparatively minor, as a rule negligible modification of the geometry of the optical element 107.1, which is adjusted via the deformation units 114, so that a corresponding control loop which detects the actual geometry of the optical element 107.1 may be dispensed with.

Subsequently, it will be checked in a step 119.6, whether a further imaging step has to be carried out. If this is not the case, the process will be terminated in step 119.7. Otherwise, the process goes back to step 119.3.

In the present example, the optical element 107.1 is supported on the holding ring 111.1 by the positioning units 113 and the deformation units 114. However, it will be understood that in other variants of the disclosure, a further support of the optical element on the holding ring may be provided. This further support may be, for example, implemented in the style of a generally known gravity compensation device, as is schematically indicated in FIG. 2 by the dotted line 120. This gravity compensation device 120 may be a multiplicity of soft spring elements that are evenly distributed over the circumference of the optical element 107.1. The gravity compensation device 120 may be implemented as a passive and/or an active device and may accommodate in a conventional manner at least a large part of the weight force of the optical element 107.1.

Moreover, in the present example, the support of the optical element 107.1 is shown as a standing support (i.e. the holding ring 111.1 supports the optical element 107.1 from below). However, it will be understood that the support of the optical element may also be implemented as a suspended support, which means the optical element is suspended from the holding ring (from below). However, it will further be understood that in other variants of the disclosure, also any other desired orientation of the optical element relative to the vertical direction may be provided.

Second Embodiment

A further preferred embodiment of the optical device 208 according to the disclosure will be described below with reference to FIGS. 1 to 5 and 6, which may be used in the objective 104 instead of the optical device 108. The optical device 208, in its structure and functionality, in principle corresponds to the optical device 108, so that only the differences will be addressed here. In particular, identical or like components are identified here with reference numerals that are respectively increased by 100. Unless otherwise stated below, in terms of the properties and functions of these components, reference is made to the above explanations given with regard to the first embodiment.

Figure 6:
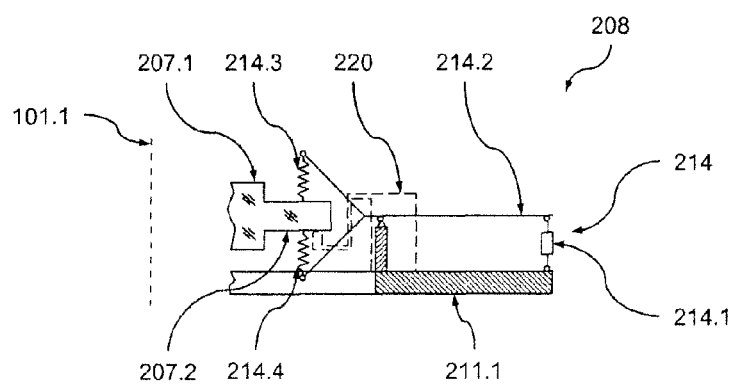
FIG. 6 shows a schematic illustration of a part of a further preferred embodiment of the optical device according to the disclosure of the imaging device of FIG. 1.

The optical device 208 differs from the optical device 108 only in respect of the design and the connections of the deformation units 214 to the optical element 207.1. FIG. 6 shows a detail of the optical device 208 which, in terms of its position, corresponds to detail VI in FIG. 2.

As can be seen from highly schematic FIG. 6, in this embodiment, the transmission element 214.2 of the deformation unit 214 is formed as a lever arm that is connected (between its two ends) to the holding ring 211.1 in an articulated manner. The articulated support on the holding ring 211.1 may be designed in any desired way. It is preferably formed in the style of a solid-body joint.

The lever arm 214.2 in turn is connected with one end to an actuator unit 214.1, whilst the other end is of a fork-shaped design and acts from both sides (which approach, in the present horizontal installation position of the optical element 207.1 from the top and from the bottom) on a projection 207.2 on the circumference of the optical element 207.1 respectively via an elastic section 214.3 and 214.4. The above-described low rigidity of the transmission element 214.2 can in this design be achieved and adjusted through the rigidity of the lever arm 214.2 and/or the rigidity of the elastic sections 214.3 and 214.4.

The present design has the advantage that it may be applied in a simple manner with conventional designs for optical elements, which often already have one (continuous) or more (usually evenly distributed) such projections 207.2 on the circumference thereof. Particularly advantageously therefore, the present solution may thus be incorporated into a design that is principally known, wherein the optical element 207.1 is supported in a generally known manner (optionally in addition to further support devices) via a gravity compensation device, which includes a multiplicity of spring elements which are distributed over the circumference of the optical element 207.1 and which engage on a flange 207.2 of the optical element 207.1, as is indicated in FIG. 6 by the dotted contour 220.

However, it is to be understood that, in other variants of the disclosure, also any other desired design of the transmission element may be chosen. It is in particular possible, as will be explained in detail below, to design also the transmission element itself as well as its connection with the optical element to be especially rigid, in order to impose a predetermined deformation directly on the optical element.

Third Embodiment

A further preferred embodiment of the optical device 308 according to the disclosure will be described below with reference to FIGS. 1, 4, 5 and 7, which may be used instead of the optical device 108 in the microlithography apparatus 101 and by which the method of FIG. 5 may be carried out. The optical device 308, in its structure and functionality, in principle corresponds to the optical device 108 of FIG. 2 (wherein the mechanical equivalent circuit diagram from FIG. 4 may also be used for the optical device 308), so that only the differences will be addressed here. In particular, identical or like components are identified here with reference numerals that are respectively increased by 200. Unless otherwise stated below, in terms of the properties and functions of these components, reference is made to the above explanations given with regard to the first embodiment.

The difference between the optical device 308 and the optical device 108 lies in the design of the holding units 312. Whilst here again a number of deformation units 314 which are evenly distributed over the circumference of the optical element 307.1 are provided, in this variant, a gravity compensation device 320 is provided instead of the positioning units 113. This gravity compensation device 320 includes a multiplicity of spring elements 320.1 evenly distributed over the circumference of the optical element 307.1, which accommodate in a generally known manner the weight force of the optical element 307.1. However, the spring elements 320.1 are formed here to be comparatively rigid (i.e. the first rigidity $C1i$ in FIG. 4 is by a factor of approximately 500 to 1,000 higher than $C3j$).

Each of the deformation units 314 includes an actuator unit 314.1 which is also comparatively rigid (in its actuation direction) and which provides for short travel ranges with a high resolution. To this end, principally any desired actuators may be used which fulfil this desired property. For example, piezo actuators, mechanical linear drives wherein a vertical movement is generated by a rotational drive via a corresponding transmission or the like may be used for this purpose. The advantages of such actuators include the fact that they may be implemented to be particularly compact.

Further, in the present example the j deformation units 314 are implemented to be as rigid as possible (i.e. the third rigidity $C3j$ is comparatively high) in the force flux direction (which acts therein as they support the optical element 307.1), in order to realise a predeterminable high natural frequency of the support. This may be realised, for example, in the area of the transmission element 314.2 by forming the same as a correspondingly rigid radial extension of the optical element. For example, this may simply be a lever arm 314.2 that is monolithically formed at the optical element 307.1. The rigidities $C2j$ and $C4j$ according to FIG. 4, both of which represent here the rigidity of the holding ring 311.1 at the location j, will be addressed below.

With the design described above, a comparatively large number of influencing parameters on the shape functions FDj of the respective deformation units 314 may eventually result. Thus, the respective actuator unit 314.1 generates, with the same travel range or the same displacement V, another shape function FDj as well as other rigid body movements. These are dependent on the position of the respective deformation unit 314 (in the circumferential direction of the optical element 307.1) and the respective values of the first and third rigidities $C1j$, $C3j$ and the fourth rigidity $C4j$.

As mentioned before, in terms of the present disclosure, the shape function FDj indicates the deformation response of the deformation unit 314 to a pre-defined (normalised) displacement and/or a pre-defined (normalised) force effect in the area of the actuator unit 314.1. Thus, the shape function FDj is also representative of the loads that are introduced into the optical element 307.1 with the pre-defined displacement and/or force effect.

In view of the above-described comparatively large variation of the shape function FDj between the individual deformation units 314 it is of advantage if the fourth rigidity $C4j$ is as high as possible, which means in particular that also the holding ring 311.1 is formed to be particularly rigid, in order to keep the effect of any deformations of the holding ring 311.1, which result from the actuation of one of the deformation units 314, on the position and/or the orientation of the other deformation units 314 as low as possible.

In a borderline case for a holding ring 311.1 designed to be infinitely rigid with rigidities $C1j$, $C3j$ that are identical with each other, the same shape function would then be obtained for each actuator unit, if the actuator units were equidistantly arranged on the same circumference.

In this case it would then advantageously be possible to adjust—in sufficiently good approximation—a pre-defined deformation of the optical element 307.1 via a simple control without a complex control algorithm, provided the respective shape function FDj is known. The shape function FDj may have been determined theoretically (for example by appropriate simulation calculations) and/or experimentally (for example by appropriate measurement) in advance and stored in the control device 315 as a corresponding model.

In the control device 315, the currently detected value of the variable representative of the imaging error to be corrected is then compared in step 119.4 of FIG. 5 with a setpoint value for this variable, which was specified for the current operating condition of the microlithography apparatus 101. From this comparison, the control device 315 then determines (for example by way of an appropriate adaptation using the stored functions FDj) a specification for the geometry of the optical element 307.1, which means a specification for the deformation of the optical element 307.1 as well as a specification for the position and the orientation of the optical element 307.1, and determines from this the control signals for the actuator units 314.1 of the deformation units 314, via which the deformation, the position and the orientation of the optical element 307.1 will be adjusted. For this purpose, the control device 315 accesses the stored model (which was previously theoretically and/or experimentally determined) of the optical module 309.

Optionally, the control device 315 additionally determines from the above-mentioned comparison and/or by a different specification from the imaging process to be carried out a further specification for the position and/or the orientation of the optical module 309 and thus also of the optical element 307.1, and determines from this further control signals for the support units 310.1.

In step 119.5, the control device 315 then controls in the above-described manner the actuator units 314.1 of the deformation units 314 and optionally the support units 310.1 by the determined control signals, in order to counteract any deviation of the current condition of the optical module 309, in particular of the optical element 307.1, from a setpoint condition specified for the present operating condition, in particular to counteract a currently present imaging error.

The above-described design has the advantage that it may be designed, in particular with respect to the actuators, to be especially compact and that it is therefore particularly suitable for the integration of an active deformation of an optical element into a pre-existing optical design. Optionally, it is also possible with this variant to replace, in an existing design of an optical imaging system, one of the previous optical elements with the optical element 307.1 that is disposed in the optical module 309, without having to modify the remaining design of the optical imaging system.

In this case, the support units 310.1 are again advantageously detachably connected to the optical module 309 so as to ensure that the optical module 309 can be replaced in a simple manner. However, it will be understood that, in other variants of the disclosure, such a connection between the optical module and the support structure, which can be released in a simple manner, may also be absent.

In the present example, again a simple displacement actuator may be used for the actuator unit 314.1, which displacement actuator generates a pre-defined displacement in its acting direction as a function of a pre-defined control signal. In other variants of the disclosure, the actuator unit 314.1 may again be a force actuator that generates a pre-defined force in its acting direction as a function of a pre-defined control signal. In any case it is of advantage in both cases if the variance of the third rigidity $C3j$ is as low as possible, in order to achieve an altogether low variance of the shape function FDj.

In the present example, the support of the optical element 307.1 is further shown as a suspended support (i.e. the optical element 107.1 is suspended to the holding ring 311.1 from below). However, it will be understood that the support of the optical element may also be designed as a standing support, which means that the optical element is supported on the holding ring (from above). To this end, in particular, for example a configuration similar to the arrangement shown in FIG. 6 may be selected. It will further be understood that in other variants of the disclosure, of course, also any other orientation of the optical element in relation to the vertical direction may be contemplated.

Fourth Embodiment

A further preferred embodiment of the optical device 408 according to the disclosure will be described below with reference to FIGS. 1, 4, 5 and 8, which may be used instead of the optical device 108 in the microlithography apparatus 101 and by which the method of FIG. 5 may be carried out. The optical device 408, in its structure and functionality, in principle corresponds to the optical device 308 of FIG. 7 (wherein the mechanical equivalent circuit diagram from FIG. 4 may also be used for the optical device 408), so that only the differences will be addressed here. In particular, identical or like components are identified here with reference numerals that are respectively increased by 100. Unless otherwise stated below, in terms of the properties and functions of these components, reference is made to the above explanations given with regard to the third and first embodiment, respectively.

The difference between the optical device 408 and the optical device 308 lies in the design of the holding units 412. In the present example, these include exclusively a number of deformation units 414 which are evenly distributed over the circumference of the optical element 407.1. Each of the deformation units 414 in turn includes an actuator unit 414.1 which is comparatively rigid (in its actuation direction) and which provides small travel ranges with a high resolution. For this purpose, in principle any desired actuators may be used which fulfil this desired property. For example, piezo actuators, mechanical linear drives in which a vertical movement is generated by a rotational drive via a corresponding transmission or the like may be used for this purpose. The advantages of such actuators include the fact that they may be designed to be especially compact.

In the present example, the j deformation units 414 are again formed to be as rigid as possible (i.e. the third rigidity $C3j$ and the fourth rigidity $C4j$ are also comparatively high) in the force flux direction (which acts therein as they support the optical element 407.1) so as to realise a predeterminable high natural frequency of the support.

With the above-described design, optionally a comparatively high variance of the shape functions FDj of the respective deformation units 414 is again achieved. This means, the respective actuator unit 414.1 generates, with the same travel range and the same displacement V, a different shape function FDj as well as different rigid body movements. These are dependent on the position of the respective deformation unit 414 (in the circumferential direction of the optical element 407.1) and the respective value of the third rigidity $C3j$ and the fourth rigidity $C4j$.

As has already been mentioned, in terms of the present disclosure, the shape function FDj indicates the deformation response of the deformation unit 414 to a pre-defined (normalised) displacement and/or a pre-defined (normalised) force effect in the area of the actuator unit 414.1. Therefore, the shape function FDj is also representative of the loads that are introduced into the optical element 407.1 during the pre-defined displacement and/or force effect.

In order to keep the complexity of the design of the deformation units 414 and the holding ring 411.1 low so as to reduce the disturbance of the shape functions FDj, a measuring device 421 is provided in the present example, which includes an annular reference structure 421.1 and a plurality of measuring units 421.2, which are distributed (preferably evenly) over the circumference of the reference structure 421.1.

The respective measuring unit 421.2 detects in any desired suitable manner a measurement value (with sufficient accuracy), the measurement value that is representative of the geometry of the optical element 407.1. In the present example, a measurement value is detected for this purpose, which is representative of the distance between a reference point on the reference structure 421.1 (for example a point in the area of the connection of the respective measuring unit 421.2 with the reference structure 421.1) and an associated measuring point on the optical element 407.1. To this end, any suitable measurement principles (interferometric principles, capacitive principle, fibre-optical sensors, scales etc.) that allow a sufficiently precise detection of the distance may be used either individually or in combination. However, it will be understood that in other variants of the disclosure, also any other measurement principles may be applied instead of or in addition to such a distance measurement, which allow a conclusion to be made as to the current geometry of the optical element.

From the values of the respective measuring variables, which were obtained in this way using the individual measuring units 421.2, one or more detection values may be determined, which allow conclusions to be made as to the current geometry and thus the current deformation of the optical element 407.1. In the present example, the use of the distance measurement here has the further advantage that in addition conclusions may be made as to the position and/or the orientation of the optical element 407.1.

In the control device 415, the currently detected value for the variable representative of the imaging error is then compared with a setpoint value for this variable in step 119.4 of FIG. 5, which is specified for the current operating condition of the microlithography apparatus 101. From this comparison, the control device 415 determines (for example by an appropriate adaptation using the stored functions FDj) a specification for the geometry of the optical element 407.1, which means a specification for the deformation of the optical element 407.1, and determines therefrom the control signals for the actuator units 414.1 of the deformation units 414, via which the deformation, the position and the orientation of the optical element 407.1 will be adjusted. To this end, the control device 415 accesses, if desired, a stored model (which was theoretically and/or experimentally determined) of the optical module 409. Further, it optionally takes into account here the detection value(s) determined in the above-described manner, which is or are representative of the current deformation, position and/or orientation of the optical element 407.1.

If desired, the control device 415 additionally determines from the aforementioned comparison and/or from another specification from the imaging process to be carried out a further specification for the position and/or the orientation of the optical module 409 and thus also of the optical element 407.1 and optionally determines from this further control signals for the support units 410.1.

In step 119.5, the control device 415 then controls in the above-described manner the actuator units 414.1 of the deformation units 414 and optionally the support units 410.1 using the determined control signals, in order to counteract any deviation of the current condition of the optical module 409, in particular of the optical element 407.1, from a setpoint condition specified for the present operating condition, in particular to counteract a currently present imaging error. In this connection, the current condition (the deformation, the position and/or the orientation in relation to the reference structure 421.1) of the optical element 407.1 is continuously detected via the measuring unit 421 and is processed in the control device 214 so as to achieve that the current preset condition is quickly reached via a control loop realised in this way.

The above-described design including the measuring device 421 has the advantage that, apart from the achievement of a certain predetermined natural frequency, no particular further desired properties will have to be met by the support of the optical element 407.1 in relation to rigidity (in particular of the holding units 412 and the holding ring 411.1), so that there is a greater freedom of design in this respect. In particular, any desired suitable actuators as well as any desired suitable transmission elements may be used here. Preferably, however, a rigidity as high as possible is provided here in particular for the deformation units 414 and the holding ring 411.11.

Due to the freedom of design obtained in this way it is possible to design the components of the optical module 409 in a space optimised manner, so that this solution is also particularly well suited for the integration of an active deformation of an optical element in a pre-existing optical design. If desired, it is therefore possible with this variant to replace in an existing design of an optical imaging system one of the previous optical elements with the optical element 407.1 disposed in the optical module 409, without having to modify the remaining design of the optical imaging system.

In this case, the support units 410.1 are again advantageously detachably connected to the optical module 409, in order to ensure that the optical module 409 may be replaced in a simple manner. However, it will be understood that, in other variants of the disclosure, such a connection between the optical module and the support structure, which can be released in a simple manner, may also be absent.

In the present example, a simple displacement actuator may again be used for the actuator unit 414.1, which generates a pre-defined displacement in its acting direction as a function of a pre-defined control signal. In other variants of the disclosure, the actuator unit 414.1 may again be a force actuator that generates a pre-defined force in its acting direction as a function of a pre-defined control signal.

With regard to the design of the reference structure 421.1 it is to be noted that the latter preferably has a sensitivity with regard to thermal and/or mechanical disturbances, which is as low as possible. Preferably, it is therefore realised from one or more materials having a low thermal expansion coefficient and a high rigidity. Examples of such materials include $SiO_2$, glass ceramics, Invar® etc.

It is to be noted at this point for the sake of completeness that such a material selection may also be of advantage for the remaining components of the respective optical module and the respective support structure of all of the embodiments of the present disclosure. In the present example, the reference structure 421.1 is supported on the holding ring 411.1. However, it will be understood that, in other variants of the disclosure, it may also be provided that the reference structure is supported on the support structure 410.2.

In the present example, the support of the reference structure 421.1 is preferably designed in such a way that a deformation of the holding ring 411.1 has, if possible, no effect on the position and/or the orientation of the reference structure 421.1. In the present example this is realised by the fact that the reference structure is supported on the holding ring 411.1 in the area of three supporting points, statically determined, which are arranged in the area of the three supporting points on which the holding ring 411.1 is supported by the support units 410.1.

Fifth Embodiment

A further preferred embodiment of the optical device 508 according to the disclosure will be described below with reference to FIGS. 1, 4, 5 and 9, which may be used instead of the optical device 108 in the microlithography apparatus 101 and on which the method of FIG. 5 may be carried out. The optical device 508, in its structure and functionality, in principle corresponds to the optical device 108 of FIG. 2 (wherein the mechanical equivalent circuit diagram from FIG. 4 may also be used for the optical device 508), so that only the differences will be addressed here. In particular, identical or like components are identified here with reference numerals that are respectively increased by 400. Unless otherwise stated below, in terms of the properties and functions of these components, reference is made to the above explanations given with regard to the first embodiment.

The only difference between the optical device 508 and the optical device 108 is that the deformation units 514 (which are otherwise constructed in a manner identical with the deformation units 114) are not directly supported on the holding ring 511.1 but on a separate (from the holding ring 511.1) abutment structure in the form of an abutment ring 522. This abutment ring 522 is in turn supported (preferably in a statically determined way) on the holding ring 511.1 (in the present example suspended), on which the optical element 507.1 is supported via positioning units 513 (which are designed to be identical with the positioning units 113). Otherwise, the optical module 509 is identical with the optical module 109.

In the present example, the support of the abutment ring 522 is preferably designed in such a way that a deformation of the holding ring 511.1 has an effect on the position and/or the orientation of the abutment ring 522 that is as low as possible. In the present example this is realised by the fact that the abutment ring 522 is supported, in a statically determined way, on the holding ring 511.1 in the area of three supporting points which are arranged in the area of the three supporting points, on which the holding ring 511.1 is supported on the support structure 510.2 by the support units 510.1.

By this abutment structure that is separate from the holding structure it is, for example, possible to provide in a simple manner a pre-existing optical module or a pre-existing design of such an optical module with an active deformation of the optical element. It is to be understood in this connection that such a separate abutment structure may be introduced not only in the case of a design as described in connection with the first embodiment, but that it can be used also for any other designs, in particular the designs from the other embodiments.

Figure 9:
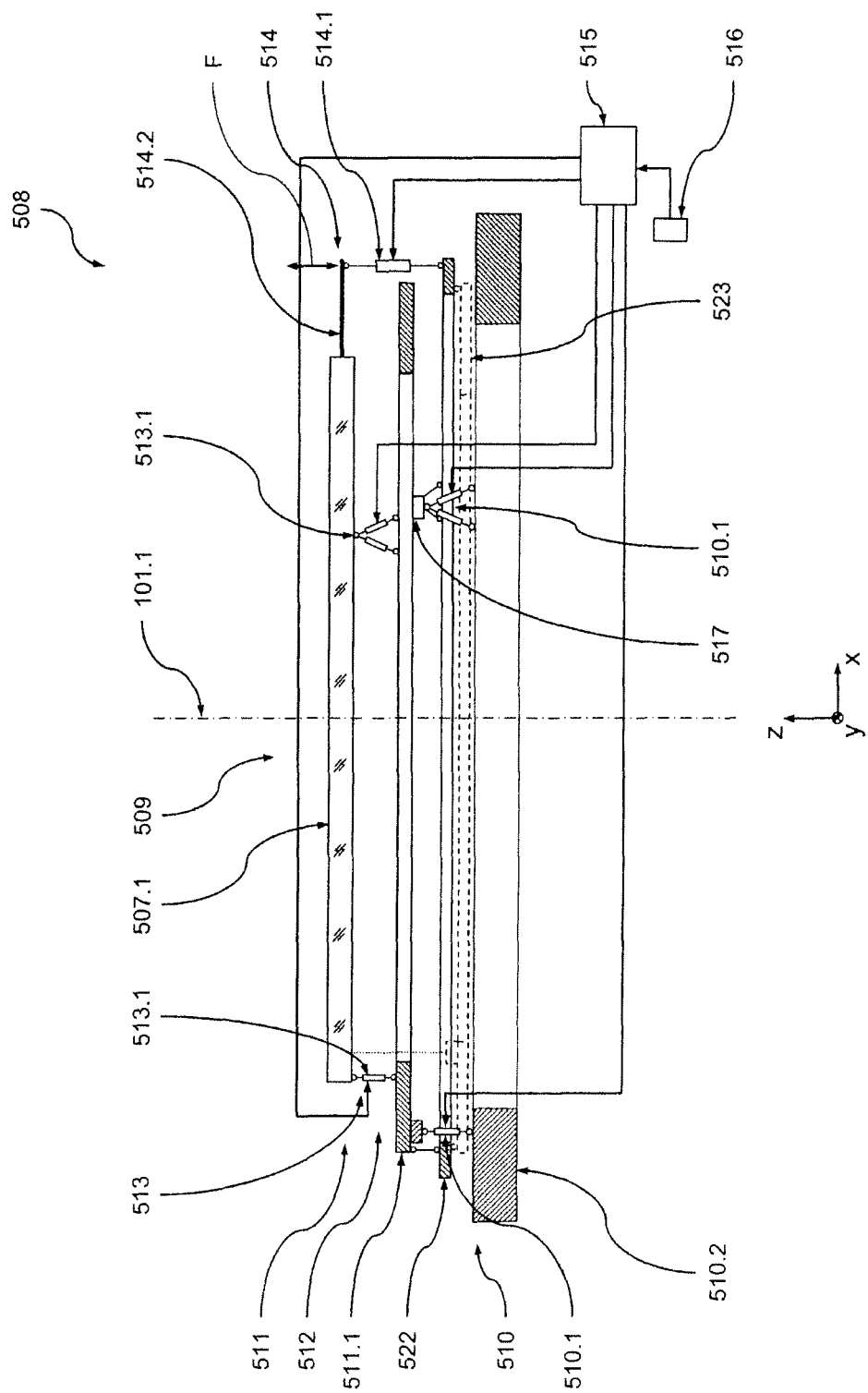
FIG. 9 shows a schematic sectional view of a further preferred embodiment of the optical device according to the disclosure of the optical imaging device of FIG. 1.

As was indicated in FIG. 9 by the dotted contour 523, in other variants of the disclosure, it is provided that a measuring device (which is, for example, identical in terms of its structure and functionality with the measuring device 421) is also supported on the separate abutment structure 522.

The present disclosure was described above by examples, in which exclusively optically active elements of an objective were actively deformed. However, it is to be noted again at this point that the disclosure may of course also be used for the active deformation of other optically active elements, for example of optical elements of the illumination device or of other optically active components of the imaging device, in particular of components of the mask device and/or of the substrate device.

Finally, it is to be noted that the present disclosure was described above examples from the field of microlithography. However, it is to be understood that the present disclosure may also be used for any other applications or imaging processes, in particular with any desired wavelengths of the light used for imaging.

What is claimed is:

1. An optical device, comprising:
    an optical element;
    a holding device, comprising:
        a holding structure that supports the optical element; and
        a deformation device comprising a plurality of active deformation units; and
    a measuring device comprising a reference structure connected to the holding structure or the abutment structure and at least one measuring unit,
    wherein:
        the plurality of active deformation units contact the optical element;
        the plurality of active deformation units are configured to impose a pre-defined deformation on the optical element;
        the deformation device comprises a separate abutment structure fixed to the holding structure;
        at least one of the plurality of deformation units is supported on the abutment structure;
        the at least one measuring unit is configured to capture a measurement value representative of a distance between the reference structure and a measuring point of the optical element;
        the measuring device is configured to determine, based on the measurement value, a detection value representative of a deformation of the optical element; and
        the optical device is a microlithography optical device.

2. The optical device of claim 1, wherein the abutment structure is detachably connected to the holding structure.

3. The optical device of claim 1, further comprising a support structure, wherein the holding structure is detachably connected to the support structure in an area of at least one supporting point.

4. The optical device of claim 1, further comprising a support structure and an actively controllable adjustment unit, wherein the controllable adjustment unit adjustably connects the holding structure to the support structure in an area of at least one supporting point.

5. The optical device of claim 4, wherein the at least one supporting point is a first supporting point, and the holding structure supports the optical element in an area of at least one second supporting point which is located in the area of the first supporting point.

6. The optical device of claim 1, further comprising a holding unit, wherein the holding device supports the optical element in a supporting direction via the holding unit, and the holding unit is substantially rigid in the supporting direction.

7. The optical device of claim 6, wherein the holding unit is an active positioning unit, and the holding unit is configured to actively adjust at least one member selected from the group consisting of a position of the optical element and an orientation of the optical element.

8. The optical device of claim 1, wherein:
    the holding structure supports the optical element in an area of at least one supporting point;
    the holding structure supports the measuring device in an area of at least one further supporting point; and
    the at least one further supporting point is located in the area of the at least one supporting point for the optical element.

9. The optical device of claim 8, wherein the holding structure supports at least one member selected from the group consisting of the optical element and the measuring device in a statically determined way.

10. The optical device of claim 1, wherein:
    the holding structure supports the abutment structure in the area of at least one supporting point;
    the abutment structure supports the measuring device in the area of at least one further supporting point; and
    the at least one further supporting point is located in an area of the at least one supporting point for the abutment structure.

11. The optical device of claim 10, wherein:
    the holding structure supports the optical element in the area of at least one supporting point for the optical element;
    the holding structure supports the abutment structure in the area of at least one further supporting point for the abutment structure; and
    the at least one further supporting point for the abutment structure is located in the area of the at least one supporting point for the optical element.

12. The optical device of claim 1, wherein a deformation unit is configured to impose a displacement on the optical element in a deformation direction, and the deformation unit has a high rigidity in the deformation direction.

13. An optical imaging device, comprising:
    an illumination device; and
    a projection device comprising an optical element group, wherein:

the illumination device is configured to illuminate an object plane of the projection device;

the optical element group is configured to image the object field onto an image field;

a member selected from the group consisting of the illumination device and the projection device comprises an optical device according to claim 1; and the optical imaging device is a microlithography optical imaging device.

14. A method of holding an optical element in a microlithography device, the method comprising:

using a holding structure of a holding device to hold the optical element so that a pre-defined deformation is imposed on the optical element via a plurality of active deformation units of a deformation device of the holding device;

fixing a separate abutment structure of the deformation device to the holding structure;

supporting at least one of the deformation units on the abutment structure;

using a measuring unit of a measuring device to capture a measurement value representative of a distance between a measuring point of the optical element and a reference structure of the measuring unit, wherein the reference structure is connected to the holding structure or the abutment structure; and using the measuring device to determine, based on the measurement value, a detection value representative of a deformation of the optical element.

15. The method of claim 14, further comprising fixing the holding structure to a support structure in at least one a replaceable manner and/or an actively adjustable manner.

16. The method of claim 15, further comprising using a holding unit of the holding device to substantially rigidly supporting the optical element in a supporting direction.

17. The method of claim 16, further comprising using the holding unit to actively adjust at least one member selected from the group consisting of a position of the optical element and an orientation of the optical element.

18. The method of claim 14, further comprising using at least one deformation unit to displace the optical element in a deformation direction, wherein the at least one deformation unit has a high rigidity in the deformation direction.

* * * * *

UNITED STATES PATENT AND TRADEMARK OFFICE
CERTIFICATE OF CORRECTION

PATENT NO. : 9,798,243 B2
APPLICATION NO. : 14/969703
DATED : October 24, 2017
INVENTOR(S) : Manfred Steinbach and Armin Schoeppach It is certified that error appears in the above-identified patent and that said Letters Patent is hereby corrected as shown below:

Column 1, Lines 12-13, delete "2008 032 853.7-51" and insert -- 2008 032 853.7 --.

Column 1, Line 48, delete "manometers" and insert -- nanometers --.

Column 11, Line 2, delete "113.1," and insert -- 113.1; --.

Column 26, Line 9, Claim 15, delete "one a" and insert -- one of a --.

Signed and Sealed this
Twenty-sixth Day of December, 2017

Joseph Matal
*Performing the Functions and Duties of the
Under Secretary of Commerce for Intellectual Property and
Director of the United States Patent and Trademark Office*